United States Patent [19]
Yu et al.

[11] Patent Number: 6,028,993
[45] Date of Patent: Feb. 22, 2000

[54] TIMED CIRCUIT SIMULATION IN HARDWARE USING FPGAS

[75] Inventors: Meng-Lin Yu, Morganville; P. A. Subrahmanyam, Freehold, both of N.J.

[73] Assignee: Lucent Technologies Inc., Murray Hill, N.J.

[21] Appl. No.: 08/781,882

[22] Filed: Jan. 10, 1997

[51] Int. Cl.[7] ................................................. G06F 17/50
[52] U.S. Cl. ................. 395/500.35; 395/500.34; 395/500.36; 395/500.37; 395/500.38
[58] Field of Search ................................ 364/488, 489, 364/490, 578; 395/500, 500.35, 500.34, 500.36, 500.37, 500.38

[56] References Cited

U.S. PATENT DOCUMENTS

| | | | |
|---|---|---|---|
| 4,787,062 | 11/1988 | Nei et al. | 395/500.36 |
| 4,945,503 | 7/1990 | Takasaki | 395/500.36 |
| 5,392,227 | 2/1995 | Hiserote | 395/500.35 |
| 5,425,036 | 6/1995 | Liu et al. | 714/735 |
| 5,550,839 | 8/1996 | Buch et al. | 714/724 |
| 5,572,710 | 11/1996 | Asano et al. | 395/500.36 |
| 5,581,742 | 12/1996 | Lin et al. | 395/500.5 |
| 5,633,813 | 5/1997 | Srinivasan | 395/500.35 |
| 5,649,164 | 7/1997 | Childs et al. | 395/500.37 |
| 5,655,107 | 8/1997 | Bull | 395/500.34 |
| 5,677,848 | 10/1997 | Singh et al. | 395/500.23 |
| 5,721,695 | 2/1998 | McMinn et al. | 395/500.35 |
| 5,726,918 | 3/1998 | Giramma et al. | 395/500.35 |
| 5,752,000 | 5/1998 | McGeer et al. | 395/500.35 |

*Primary Examiner*—Kevin J. Teska
*Assistant Examiner*—Vuthe Siek

[57] ABSTRACT

A logic circuit is simulated for mapping and emulation on a field programmable gate array-based platform by mapping one or more of the circuit delays onto delay elements in the FPGA-based platform. The operations of the delay elements are controlled by one or more simulations clocks that are different from any user-specified clocks.

24 Claims, 2 Drawing Sheets

TIMED CIRCUIT SIMULATION IN HARDWARE USING FPGAS

BACKGROUND OF THE INVENTION

1. Field of the Invention

The present invention relates to the design and simulation of logic circuits.

2. Description of the Related Art

A logic circuit comprises a set of logic gates that are interconnected using wires (also referred to as "nets" or signals). Simulation of a circuit involves supplying input stimuli to the circuit at its input ports, and determining the response of the circuit at its output ports. Such simulation is normally done using a software program that models the components used in the circuit at an appropriate level, and that emulates the reaction of the circuit components to the input stimuli (i.e., the "input events") in accordance with operational semantics. The speed of a simulation depends on many factors, including the level of detail at which the circuit is modeled (e.g., semiconductor-level modeling, binary 0–1 logic levels, etc.) and the speed of the underlying execution engine.

Several patents assigned to Quickturn Design Systems, Inc., of Mountain View, Calif., disclose techniques for debugging a circuit on reconfigurable emulation systems, for example, U.S. Pat. Nos. 5,425,036 (Liu et al.), 5,448,522 (Huang), 5,448,496 (Butts et al.), 5,452,231 (Butts et al.), 5,452,239 (Dai et al.), 5,475,830 (Chen et al.), and 5,477,475 (Sample et al.), the teachings of all of which are incorporated herein by reference and referred to herein collectively as "the Quickturn technology". The Quickturn technology involves timed circuit simulation using field programmable gate arrays ("FPGAs") and techniques to map a circuit onto FPGAs without a timing problem. FPGAs are devices that provide a target technology onto which an arbitrary circuit designed for a particular application can be mapped. However, the timing of the mapped circuit, other than the storage elements, cannot be easily controlled, because the interconnection delays usually dominate the overall delay on FPGAs. The Quickturn technology relies on the physical characteristics of the FPGA, and assumes use of XILINX brand FPGAs from Xilinx Corporation. The result is that the Quickturn technology is not general, and is limited to identifying hold-time problems in 100% synchronous circuits. The Quickturn technology does not address the asynchronous portions of logic circuits which typically cause the most debugging problems.

It is an aspect of the present invention to provide an improved technique for simulating a logic circuit onto an FPGA-based platform.

Further aspects and advantages of this invention will become apparent from the detailed description which follows.

SUMMARY OF THE INVENTION

In one embodiment, the present invention is a method for simulating a logic circuit on a field programmable gate array (FPGA)-based platform in which one or more circuit delays are mapped onto one or more delay elements in the FPGA-based platform.

In another embodiment, the present invention is an FPGA-based platform on which is programmed a simulation of a logic circuit, wherein the logic circuit has been simulated by mapping one or more circuit delays onto one or more delay elements in the FPGA-based platform.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
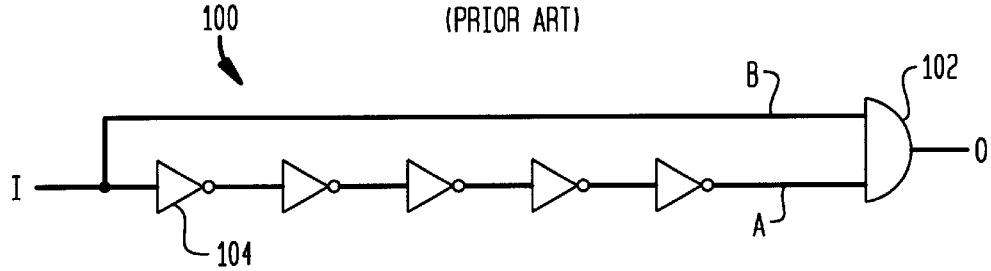
FIG. 1 is a diagram of a circuit that receives an input signal I and generates an output signal O.

According to embodiments of the invention, a logic circuit or system is simulated or emulated on a hardware testbed, specifically onto a field programmable gate array-based platform comprising one or more FPGAs. The invention comprises mapping one or more circuit delays in the simulation model onto delay elements in the FPGA-based platform, where those delay elements are controlled by special simulation clocks that are different from any user-specified (e.g., system or circuit) clock. The term "circuit delay" refers to a non-zero delay in the processing of the target logic circuit. The term "delay element" refers to any state storage element. A flip-flop is just one example of a type of delay element. By appropriately controlling the operations of the delay elements with the simulation clocks, simulation violations such as hold-time violations can be easily avoided. In general, only critical circuit delays need to be mapped into delay elements on the FPGA-based platform.

According to embodiments of the present invention, a logic circuit can be modeled using combinational logic blocks that have zero delay and other components that are associated with non-zero delays (i.e., corresponding to circuit delays). Usually at least one part of the timing sequence of the logic circuit being simulated is preserved by mapping a non-zero delay element. All of these components are interconnected in a manner such that the operation of the model correctly reflects the operation of the original (i.e., target) logic circuit. This simulation model can then be implemented using an FPGA (or a collection of FPGAs), where the zero-delay logic blocks are mapped onto appropriate combinations of primitives (i.e., basic logic elements like AND, OR, and INVERTER gates) in the FPGA and where the non-zero delay components of the simulation model are mapped onto appropriate combinations of flip-flops or delay elements in the FPGA that are driven by simulation clocks.

The present invention provides certain advantages over the prior art, including the Quickturn technology. From a simulation standpoint, speed is gained because the circuit is being modeled in hardware. In addition, the circuit model can be evaluated in parallel to the extent permitted by the parallelism that is inherent in the circuit model being evaluated. These two factors can yield a substantial gain in execution speed compared to the same simulation executed on a software platform.

From an emulation standpoint, the present invention provides explicit control of delays, which can be critical in correctly modeling/simulating/emulating the overall behavior of the circuit.

Another advantage over the Quickturn technology is that violations other than hold-time violations can be identified using the present invention.

According to the present invention, the logic circuit being simulated can be an asynchronous circuit (i. e., generally a circuit which is not controlled by a user clock), a synchronous circuit (i.e., a circuit which is controlled by a user clock, sometimes referred to as a circuit clock), or a circuit having both asynchronous and synchronous elements. Some circuits have other types of clocks as well, e.g., communication clocks.

It will be appreciated by those skilled in this art that different simulators have different timing models, and that the present invention is applicable to whatever timing model a particular simulator is designed for. It will also be appreciated that, in prior systems, once a transistor is mapped onto an FPGA, control of timing elements is lost.

For purposes of explanation, the following discussion of FIGS. 1–6 describes the application of the present invention to two different logic circuits.

Referring now to FIG. 1, there is shown a diagram of logic circuit 100, which receives an input signal I and generates an output signal O. Circuit 100 comprises AND gate 102 and five inverters 104 connected in series. AND gate 102 receives two inputs A and B. Input B comes directly from input signal I, while input A is generated by inverting input signal I five times through the chain of inverters 104. During stable state operations, the output signal O is always 0, since inputs A and B are always complementary (i.e., when A is 0, B is 1 and when A is 1, B is 0). However, when input signal I makes a transition from 0 to 1, there will be a short period of time during which the output signal O is high (i.e., logic 1). This pulse results from the additional time delay that it takes the signal transition to traverse or propagate through the chain of inverters 104. Thus, in circuit 100, the delay from I to B is always less than the delay from I to A.

Figure 2:
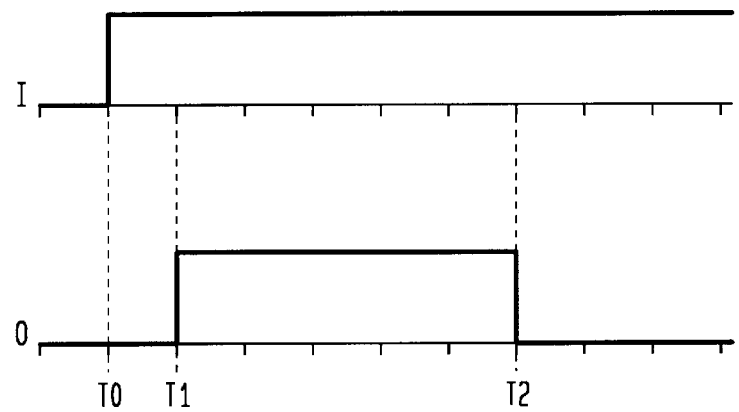
FIG. 2 is a timing diagram of the circuit of FIG. 1 for a transition of the input signal I from 0 to 1.

Referring now to FIG. 2, there is shown a timing diagram of circuit 100 of FIG. 1 for a transition of the input signal I from 0 to 1. The input signal I transition from 0 to 1 occurs a time T0. At time T1, the output signal O goes high, reflecting the time that it takes for the transition in the input signal I to reach input B and for AND gate 102 of FIG. 1 to react to that change at input B. At time T2, the output signal O returns to low, reflecting the additional time that it takes for the transition in the input signal I to propagate through the chain of inverters 104 of FIG. 1 to input A and for AND gate 102 to react to that change at input A.

Circuit 100 of FIG. 1 is a type of one-shot circuit and is used to trigger/clear/set flip-flops in many designs. Because the pulse generated by circuit 100 is usually independent of the circuit clock, a circuit like circuit 100 is usually considered to be an asynchronous circuit.

Figure 3:
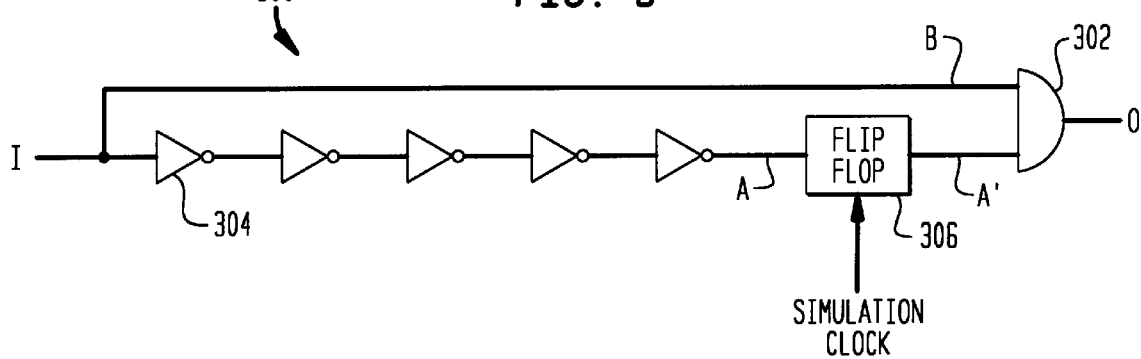
FIG. 3 is a representation of an emulation circuit that could be mapped onto an FPGA to simulate the circuit of FIG. 1, according to one embodiment of the present invention.

Referring now to FIG. 3, there is shown a representation of emulation circuit 300, which could be mapped onto an FPGA to simulate logic circuit 100 of FIG. 1, according to one embodiment of the present invention. To simplify the description, it is assumed that no logic optimization is used during the mapping. Mapping techniques using logic optimization can easily use the same principle of the invention. As shown in FIG. 3, emulation circuit 300 has simulated AND gate 302, simulated inverters 304 connected in series, and simulated flip-flop 306 controlled by a special simulation clock that is different from any emulated circuit clock. Simulated AND gate 302 and simulated inverters 304 corresponds to AND gate 102 and inverters 104 of FIG. 1, respectively. In emulating circuit 100 using FPGA mapping, flip-flop 306 is added to ensure that the delay from I to B is always less than the delay from I to A, thereby ensuring that the timing of circuit 100 is accurately simulated. It will be understood that, using conventional FPGA mapping to simulate circuit 100 in which each element of the target logic circuit is mapped to a simulated element, there is no way of guaranteeing that transitions in signal I will arrive earlier at input B than at input A. As such, circuits like circuit 100 cannot be emulated on FPGAs using such conventional techniques. By adding flip-flop 306 and controlling its operation with a simulation clock, the delay through the chain of inverters 104 of FIG. I can be guaranteed and the behavior of circuit 100 can be accurately emulated on an FPGA.

Figure 4:
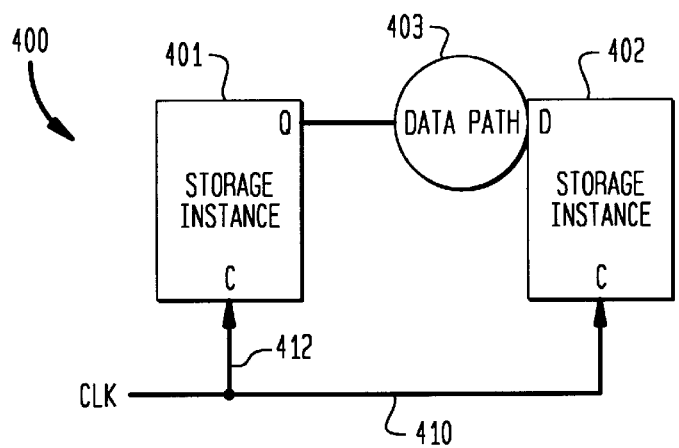
FIG. 4 is a representation of a circuit that is similar to circuit 1300 in FIG. 13a of U.S. Pat. No. 5,475,830 ("the '830 patent")

Referring now to FIG. 4, there is shown a representation of logic circuit 400. Circuit 400 is similar to circuit 1300 in FIG. 13a of U.S. Pat. No. 5,475,830 assigned to Quickturn Design Systems, Inc. ("the '830 patent"). In FIG. 4, storage instances 401 and 402 are clocked by clock signal CLK, and there exists a data path 403 between the data output terminal Q of storage instance 401 and the data input terminal D of storage instance 402.

The timing of circuit 400 is such that the data input terminal D of storage instance 402 will always be ready to accept data before the data actually arrives from storage instance 401 via data path 403. This means that the overall delay in propagating from the clock signal CLK through wire 412, storage instance 401, and data path 403 to the data input terminal D of storage instance 402 is always greater than the overall delay in propagating the clock signal CLK through wire 410 and storage instance 402 to the data input terminal D of storage instance 402. In order to ensure accurate simulation of logic circuit 400, this timing requirement must be satisfied.

Figure 5:
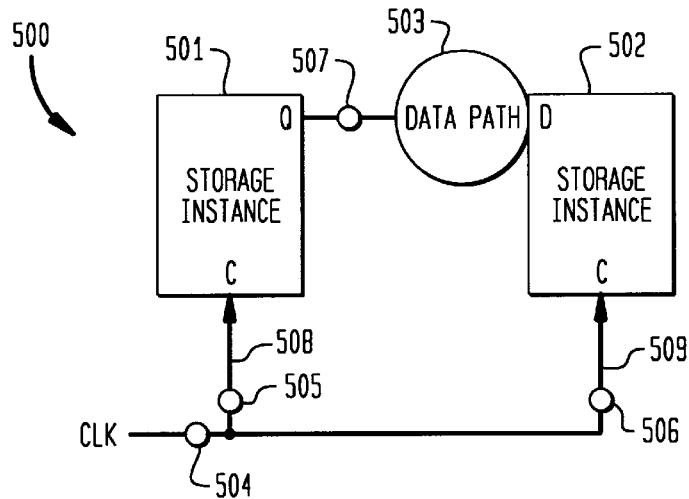
FIG. 5 is a representation of an emulation circuit that is similar to emulation circuit 1350 in FIG. 13b of the '830 patent.

Referring now to FIG. 5, there is shown a representation of mapped emulation circuit 500. Emulation circuit 500 is similar to emulation circuit 1350 in FIG. 13b of the '830 patent. As described in column 11, lines 15–28 of the '830 patent, when the target logic circuit is mapped in a logic block module, because of the interconnect structure of a clocked FPGA device, a general model for describing the timing differences between the emulation circuit 500 and the target logic circuit 400 of FIG. 4 can be obtained by introducing interconnect delay elements 504, 505, 506, and 507 into the clock and data paths of target logic circuit 400. In FIG. 5, clock signal 508 received by the clock input terminal C of storage instance 501 is the clock signal CLK delayed by interconnect delay elements 504 and 505. Likewise, clock signal 509 received by the clock input terminal C of storage instance 502 is the clock signal CLK delayed by interconnect delay elements 504 and 506. Data path 503 is also shown to be delayed by interconnect delay element 507.

As described in column 11, lines 29–45 of the '830 patent, in order to ensure that emulation circuit 500 is functional, emulation circuit 500 must satisfy the timing requirement that the delay introduced by interconnect delay element 506 cannot exceed the delay of interconnect delay element 505 by more than the delay of interconnect delay element 507. Otherwise, a hold-time violation at the data input terminal D of storage instance 502 may result from the propagation of a possible change in the data output signal from storage instance 501 arriving too early, thereby corrupting the value at the data input terminal D of storage instance 502, prior to the time the previous value is latched by the transition of clock signal 509. Since this hold-time violation is not due to an error in the design of target logic circuit 400, such an artifact resulting from improper implementation of emulation circuit 500 is particularly undesirable because substantial unproductive time and resources may be required to eliminate manually such an artifact from emulation circuit 500.

The problem of the hold-time violation is addressed in the '830 patent by making certain assumptions about using FPGAs from Xilinx Corporation and about the physical characteristics of the long and short wires (e.g., the clock net/long wire) of that FPGA family. Based on those assumptions and by carefully designing the algorithm, the '830 patent asserts that the timing requirement (i.e., that the delay of element 506 is always less than the sum of the delays of elements 505 and 507) is satisfied.

Nevertheless, the solution presented in the '830 is only as good as the assumptions on which that solution relies. If any of those assumptions is not or cannot be met, the simulation may fail. Moreover, the clock net/long wire in an FPGA is a scarce resource and this usage can result in very inefficient mapping. As a result, FPGA utilization is poor.

Figure 6:
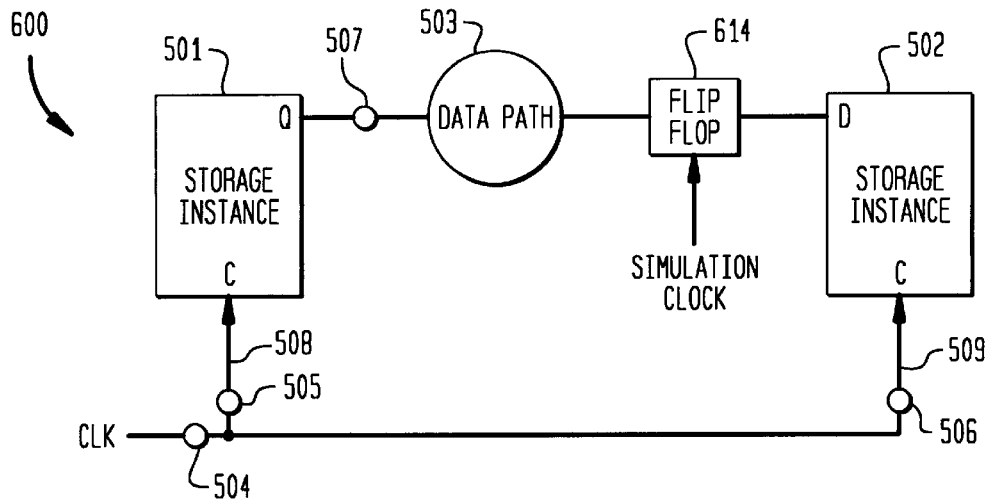
FIG. 6 is a representation of an emulation circuit that could be mapped onto an FPGA to simulate the circuit of FIG. 4, according to one embodiment of the present invention.

Referring now to FIG. 6, there is shown a representation of emulation circuit 600, which could be mapped onto an FPGA to simulate logic circuit 400 of FIG. 4, according to one embodiment of the present invention. Emulation circuit 600 is similar to emulation circuit 500 and therefore to emulation circuit 1350 of FIG. 13*b* of the '830 patent, except that flip-flop 614, controlled by a simulation clock, is added between data path 503 and the data input terminal D of storage instance 502. By adding flip-flop 614, the timing requirement is changed such that, now, the delay of element 506 must always be less than the sum of the delay of element 505 plus the delay of element 507 plus the delay of flip-flop 614. By using the simulation clock to control the operation of flip-flop 614, the timing requirement can be guaranteed, because the delay of flip-flop 614 can be made arbitrarily large. In this way, the timing requirement can be met, without having to make any of the assumptions about the FPGA made in the '830 patent. As a result, there is more freedom and greater ease in mapping onto an FPGA.

Those skilled in the art will understand that each of the examples in FIGS. 3 and 6 is only one possible embodiment of the present invention and that many other embodiments fall within the scope of the present invention. It will be understood that emulated delay elements other than flip-flops can be used and that there is an endless variety of target logic circuits that can be emulated on FPGAs using the present invention.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for simulating an original logic circuit as a hardware simulation logic circuit implemented on a field programmable gate array (FPGA)-based platform comprising the steps of:

(a) simulating each element in the original logic circuit with a corresponding simulated element of the simulation logic circuit, wherein each simulated element is controlled by one or more circuit clocks;

(b) implementing one or more additional physical delay elements in the simulation logic circuit in order to simulate one or more circuit timing delays of the original logic circuit wherein:
      the one or more additional physical delay elements do not directly correspond to physical elements in the original logic circuit; and
      the one or more circuit timing delays are mapped onto the one or more physical delay elements in the FPGA-based platform;

(c) implementing one or more simulation clocks on the FPGA independent of and asynchronous with the one or more circuit clocks; and (d) simulating processing of the original logic circuit using the FPGA-based platform, wherein the one or more additional physical delay elements are controlled by the one or more simulation clocks on the FPGA.

2. The method of claim 1, wherein the one or more simulation clocks are different from any other circuit clock.

3. The method of claim 1, wherein the platform comprises primitives and physical delay elements, one or more zero-delay logic blocks are mapped onto combinations of primitives, one or more non-zero circuit timing delays are mapped onto combinations of physical delay elements.

4. The method of claim 3, wherein the non-zero physical delay elements are driven by the one or more simulation clocks.

5. The method of claim 1, wherein at least one part of the timing sequence of the logic circuit is preserved by mapping a non-zero physical delay element.

6. The method of claim 1, wherein at least one of the physical delay elements is a flip-flop.

7. The method of claim 1, wherein the physical delay elements are left in the simulated logic circuit.

8. The method of claim 1, wherein hold-time violations and violations other than hold-time violations are identified.

9. The method of claim 1, wherein the logic circuit being simulated is an asynchronous circuit.

10. The method of claim 1, wherein the simulated logic circuit is mapped in parallel.

11. The method of claim 1, wherein the circuit timing delays are explicitly controlled by simulating the physical delay elements.

12. The method of claim 1, wherein:
   the one or more simulation clocks are different from any other circuit clock;
   the platform comprises primitives and physical delay elements, one or more zero-delay logic blocks are mapped onto combinations of primitives, one or more non-zero circuit timing delays are mapped onto combinations of physical delay elements;
   at least one part of the timing sequence of the logic circuit is preserved by mapping a non-zero physical delay element;
   at least one of the physical delay elements is a flip-flop;
   the physical delay elements are left in the simulated logic circuit; hold-time violations and violations other than hold-time violations are identified;
   the logic circuit being simulated is an asynchronous circuit; and
   the simulated logic circuit is mapped in parallel.

13. An FPGA-based platform on which is programmed a hardware simulation logic circuit corresponding to an original logic circuit, wherein the simulation logic circuit implemented on the FPGA-based platform comprises:

(a) a simulated element corresponding to each element in the original logic circuit, wherein each simulated element is controlled by one or more circuit clocks;

(b) one or more additional physical delay elements that simulate one or more circuit timing delays of the original logic circuit, wherein the one or more additional physical delay elements do not directly correspond to any physical elements in the original logic circuit; and (c) one or more simulation clocks independent of and asynchronous with each circuit clock and configured to control the one or more additional physical delay elements.

14. The FPGA-based platform of claim 13, wherein the one or more simulation clocks are different from any other circuit clock.

15. The FPGA-based platform of claim 13, wherein the platform comprises primitives and physical delay elements, one or more zero-delay logic blocks are mapped onto combinations of primitives, one or more non-zero circuit timing delays are mapped onto combinations of physical delay elements.

16. The FPGA-based platform of claim 15, wherein the non-zero physical delay elements are driven by the one or more simulation clocks.

17. The FPGA-based platform of claim 13, wherein at least one part of the timing sequence of the logic circuit is preserved by mapping a non-zero physical delay element.

18. The FPGA-based platform of claim 13, wherein at least one of the physical delay elements is a flip-flop.

19. The FPGA-based platform of claim 13, wherein the physical delay elements are left in the simulated logic circuit.

20. The FPGA-based platform of claim 13, wherein hold-time violations and violations other than hold-time violations are identified.

21. The FPGA-based platform of claim 13, wherein the logic circuit being simulated is an asynchronous circuit.

22. The FPGA-based platform of claim 13, wherein the simulated logic circuit is mapped in parallel.

23. The FPGA-based platform of claim 13, wherein the circuit timing delays are explicitly controlled by simulating the physical delay elements.

24. The FPGA-based platform of claim 13, wherein:

the one or more simulation clocks are different from any other circuit clock;

the platform comprises primitives and physical delay elements, one or more zero-delay logic blocks are mapped onto combinations of primitives, one or more non-zero circuit timing delays are mapped onto combinations of physical delay elements;

at least one part of the timing sequence of the logic circuit is preserved by mapping a non-zero physical delay element;

at least one of the physical delay elements is a flip-flop;

the physical delay elements are left in the simulated logic circuit;

hold-time violations and violations other than hold-time violations are identified;

the logic circuit being simulated is an asynchronous circuit; and the simulated logic circuit is mapped in parallel.

* * * * *